Figure 1:
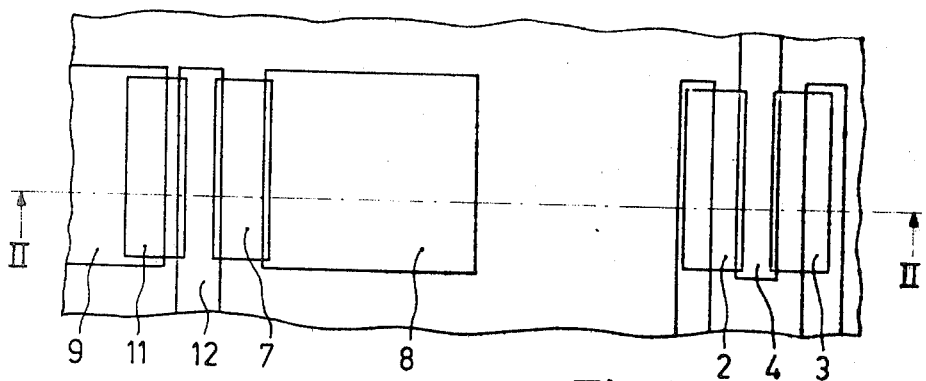

United States Patent [19] [11] 4,255,677
Boonstra et al. [45] Mar. 10, 1981

[54] CHARGE PUMP SUBSTRATE BIAS GENERATOR

[75] Inventors: Lieuwe Boonstra; Cornelis W. Lambrechtse; Roelof H. W. Salters; Rene M. G. Wijnhoven, all of Eindhoven, Netherlands

[73] Assignee: U.S. Philips Corporation, New York, N.Y.

[21] Appl. No.: 552,294

[22] Filed: Feb. 24, 1975

Related U.S. Application Data

[63] Continuation of Ser. No. 390,692, Aug. 23, 1973, abandoned.

[30] Foreign Application Priority Data

Sep. 15, 1972 [NL] Netherlands ............... 7212509

[51] Int. Cl.³ ................................... H01L 27/04
[52] U.S. Cl. ................................... 307/304; 357/23; 357/24; 357/41; 357/42; 357/43
[58] Field of Search .................. 357/23, 24, 41, 42; 307/304

[56] References Cited

U.S. PATENT DOCUMENTS

| 3,673,428 | 6/1972 | Athanas | 357/23 |
| 3,760,202 | 9/1973 | Kosonocky | 357/24 |
| 3,810,125 | 5/1974 | Stein | 357/23 |
| 3,816,769 | 6/1974 | Crowle | 307/304 |

OTHER PUBLICATIONS

Frantz et al., "Mosfet Substrate Bias Voltage Generator", IBM Tech. Discl. Bull., vol. 11, No. 10, Mar. 1969, p. 1219.

Primary Examiner—William D. Larkins
Attorney, Agent, or Firm—Thomas A. Briody; Robert T. Mayer; Steven R. Biren

[57] ABSTRACT

A semiconductor device having an integrated circuit of which a region of one conductivity type is charged by supplying charge carriers from a zone of the opposite conductivity type to an inversion layer formed in the said region below a field electrode at which a voltage is set up. When the voltage is switched off, a part of the charge carriers recombine in the said region. According to the invention, the charge carriers are supplied from a supply conductor and an electronic switch is present between said conductor and the inversion layer, which switch prevents the flow back of charge carriers to the supply conductor when the inversion layer disappears.

30 Claims, 8 Drawing Figures

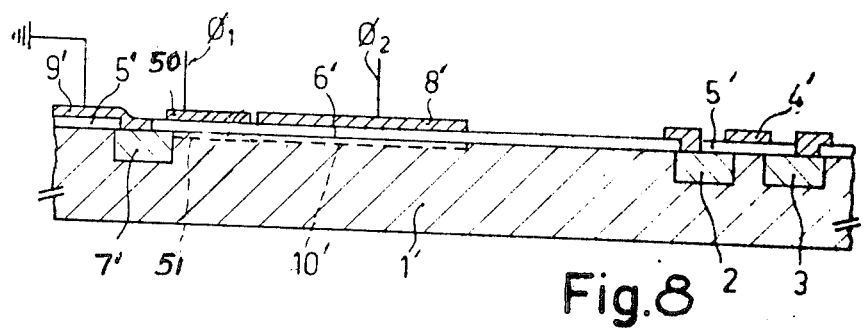

CHARGE PUMP SUBSTRATE BIAS GENERATOR

This is a continuation of application Ser. No. 390,692 filed Aug. 23, 1973, now abandoned.

The invention relates to a semiconductor device having an integrated circuit comprising a semiconductor body having a surface-adjacent first region of a first conductivity type, a second region of the second conductivity type which likewise adjoins the said surface, an electrically insulating layer present on the surface on the first region, and an electrically conductive field electrode layer which is present on said insulating layer and serves to form an inversion layer at the surface in the first region below the field electrode.

A device of the type described is known, for example, from "International Solid State Circuits Conference, Digest of Technical Papers", 1972, pp 16–17.

In this known device an inversion layer adjoining the said second region is formed below the field electrode by applying a suitable voltage to said electrodes, charge-carriers being supplied to the inversion layer from the second region provided in a substrate (the first region). When the voltage at the field electrode is reduced to a value at which the inversion layer disappears, the charge from the inversion layer flows back for the greater part to the second region. However, a small part of the charge flows away from the substrate in that a part of the charge carriers supplied from the second region recombine with charge carriers of the substrate.

The small quantity of charge thus injected in the substrate flows away in the form of extra substrate current via a connection conductor provided on the substrate. According to the above-mentioned publication, said small extra substrate current is sufficient to maintain the reverse voltage across the p-n junction between the second region and the substrate with a comparatively low frequency of the voltage pulses at the field electrode, and therefore said current is also used in the known device to compensate for the potential loss of the second region which is formed by the leakage current across the said p-n-junction.

The invention is based inter alia on the consideration that the charge injected into the first region via the inversion layer may be used to bring the potential of the first region at a desired value in contrast with the described known device in which said charge is immediately removed from the substrate via the connection conductor. Such a method of charging a semiconductor region has been found to have important advantages as will be described in detail hereinafter.

For the rapid supply of a comparatively large quantity of charge to the first region, however, the described known device in which only small quantities of charge need be injected into the first region, is not suitable. Both the quantity of the supplied charge and the rate at which the charge carriers are supplied are comparatively small in the known device, since all the charge must be supplied from the second region which of course has only a restricted capacity, and since when the field electrode voltage is omitted most of the charge carriers can flow back again from the inversion layer to the second region without recombining in the first region.

It is therefore one of the objects of the invention to provide a device in which the drawbacks occurring in the known device are avoided or at least are reduced considerably and in which the said first region can rapidly be charged to a desired potential.

Another object of the invention is to provide a device in which a semiconductor region which, if desired, is not even provided with a connection conductor, can be brought to a desired potential in a comparatively simple manner.

Still another object of the invention is to provide a device in which in an integrated circuit which is operated with one or more alternating voltages, for example clock voltages of the same polarity with respect to a given reference voltage, a semiconductor region is charged to a potential of a polarity opposite to that of the said clock voltages without the use of an extra voltage source.

The invention is based inter alia on the recognition of the fact that, by using an integrated electronic switch in a suitable place in the circuit, a rapid supply of charge to the inversion layer can take place, in which a comparatively large part of said charge can contribute to charging the first region.

The invention is also based on the recognition of the fact that by using such an electronic switch, the number of connection conductors of the integrated circuit can in many cases be reduced.

Therefore a device of the type described in the preamble is characterized according to the invention in that for charging the first region a supply conductor forming a conductive connection with a surface region of the body separated from the first region is provided for supplying charge carriers via the second region to the inversion layer, and that an electronic switch, with which switch the flowback of charge from the inversion layer to the supply conductor can be prevented, is incorporated in the current path between the supply conductor and the region where the inversion layer is formed.

An electronic switch is to be understood to mean generally in this application a switching element which, when incorporated in a current path, can pass (in the closed condition) or interrupt (in the open condition) the current in one or in both directions under the influence of a voltage or current applied to the switch.

The said inversion layer preferably adjoins the second region although the connection between the second region and the inversion layer may also be realized by means of a further gate electrode, or by choosing the distance between the second region and the inversion layer sufficiently small, for instance smaller than one diffusion length for minority carriers of the first region.

The electronic switch may be present, for example, between the second region and the inversion layer and be formed by a gate electrode which is present on the insulating layer and below which, with a suitably chosen voltage at the gate electrode, a second inversion layer is formed through which charge carriers can flow from the second region to the first inversion layer. The supply conductor will in that case (preferably) be provided on the second region.

According to the invention, however, the electronic switch is advantageously incorporated in the current path between the supply conductor and the second region, the charge carriers being supplied directly from the second region to the inversion layer below the field electrode.

In the device according to the invention and when the electronic switch is closed, a substantially unrestricted quantity of charge can rapidly be supplied via the supply conductor to the second region and thence to the inversion layer in contrast with the known devices in which only a restricted quantity of charge can be supplied from the second region. When subsequently the electronic switch is opened, the return path of the charge carriers in the direction of the supply conductor is cut off and when the voltage at the field electrode is then reduced in such manner that the inversion layer disappears, a large part of the charge carriers present in the inversion layer will recombine directly or indirectly with majority charge carriers in the first region. As a result of this the first region is charged, for example, to a negative potential, when the second region is n-type and the first region is p-type conductive.

The use of the invention is of particular advantage in those cases in which it is undesirable for some reason or another to provide the first region with a connection conductor, while nevertheless said region is to be brought at a given desired potential. According to the invention, an important preferred embodiment is therefore characterized in that the first region has no connection conductor. The first region may be, for example, the substrate of a monolithic integrated circuit and the invention inter alia makes it possible to give said substrate a desired potential without for that purpose a connection conductor being provided on the substrate. This may be of great importance for designing such an integrated circuit, since as a result of this it is possible in certain cases to use a smaller type of envelope than would be the case without using the invention.

The device according to the invention furthermore presents the possibility of charging the first region to a potential which cannot be obtained by means of the voltage source necessary for operating the further circuit and for which in normal circumstances a separate voltage source or current source would thus be necessary. Such a potential can sometimes be applied advantageously to a point of the circuit present outside the first region. A further important preferred embodiment according to the invention is therefore characterized in that the first region is conductively connected to a point of the integrated circuit so as to bring said point at the potential of the first region.

In particular in this latter case the first region, instead of being the substrate of the circuit may advantageously be an island-shaped region which is electrically insulated from the substrate.

The electronic switch may be constructed in several manners. A very simple electronic switch is formed by a rectifying diode in which the diode becomes conductive (the switch is "closed") when such a voltage is applied to the diode in the forward direction that the forward voltage across the diode becomes larger than the threshold voltage. One side of such a diode is connected to the second region while the other region is connected to the supply conductor. This may be, for example, a p-n diode or a Schottky diode.

According to another preferred embodiment, the electronic switch is formed by a transistor, for example, a thin-film transistor provided on an insulating layer present on the semiconductor surface, by a bipolar transistor (possibly a four-layer transistor or multi-layer transistor such as a thyristor), or by a "junction" field effect transistor.

Of particular advantage is a construction in which the electronic switch is formed by an insulated gate field effect transistor the source and drain zones of which are formed by the second region and by a surface zone of the second conductivity type which is separated from the second region and on which the supply conductor is provided. This construction is particularly advantageous because all the necessary surface zones of the second conductivity type can be provided in one and the same doping step, for example, a diffusion step. In order to be able to rapidly supply a comparatively large quantity of charge, the surface of the field electrode is chosen to be at least 10 times and preferably at least 50 times larger than the surface of the gate electrode of the field effect transistor between the second region and the said surface zone of the second conductivity type. The geometry of the field electrode should preferably be chosen to be so that the distance which charge carriers originating from the second region have to cover to reach the farthest remote edge of the inversion layer is as small as possible so as to facilitate a rapid charging. This form of the device is preferably operated so that voltages of the same polarity relative to a reference potential, for example, relative to earth, are applied to the gate electrode and to the field electrode as a result of which inversion layers are formed below said electrodes, after which first the gate electrode voltage and then the field electrode voltage are reduced to a value at which the inversion layer present below said electrode disappears. Generally, the firstregion will obtain a potential of a polarity opposite to that of the gate and field electrode voltages relative to the original value. This may be of importance in particular in circuits operated by means of clock voltages in which the said gate and field electrode voltage can be derived directly from the clock voltage sources already available. So for applying the said voltages, clock voltages are used which operate a semiconductor circuit element incorporated elsewhere in the integrated circuit.

Figure 2:
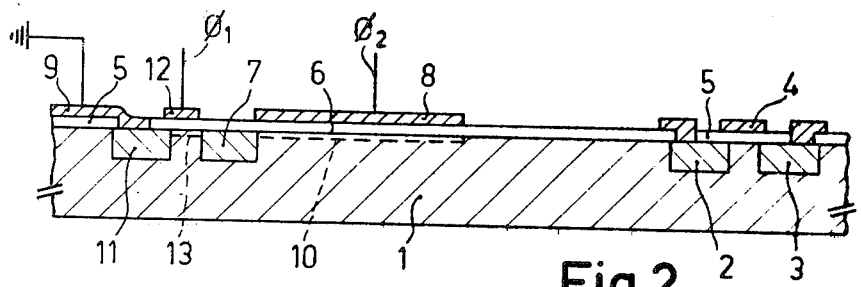
Figure 3:
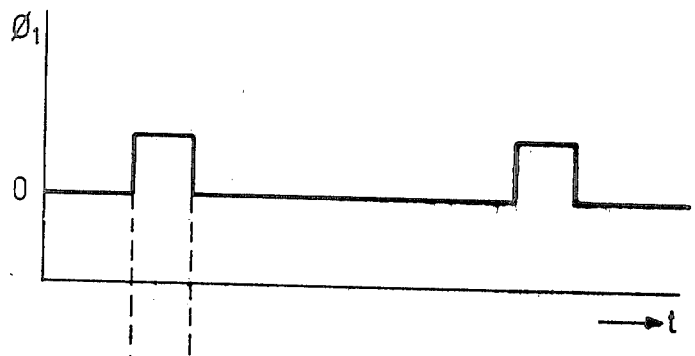
Figure 4:
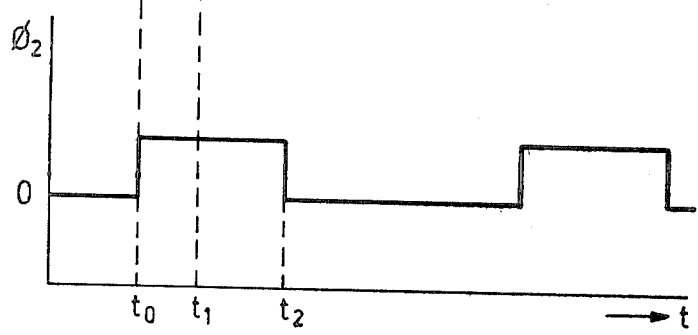
Figure 5:
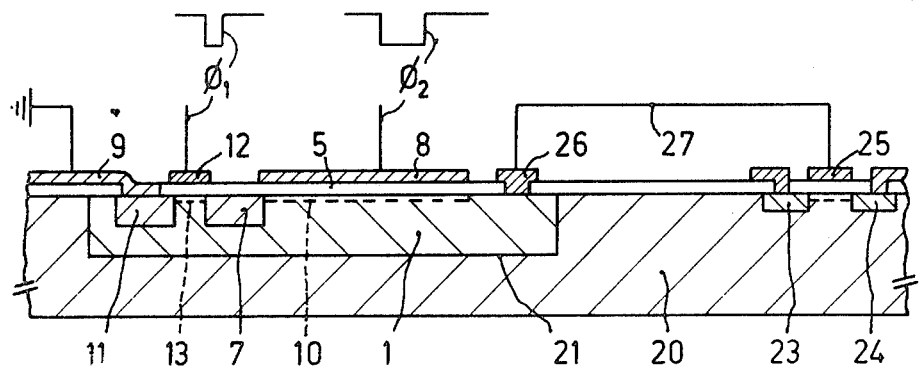
Figure 6:
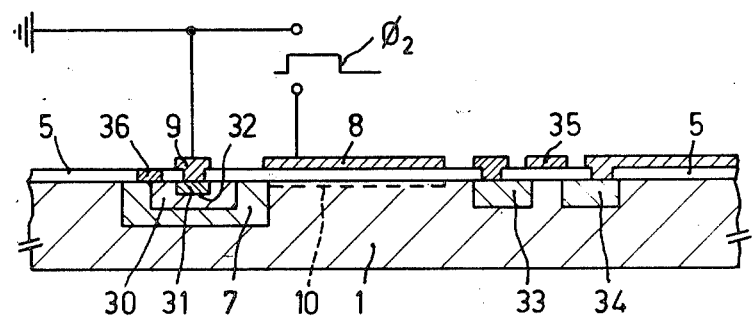
Figure 7:
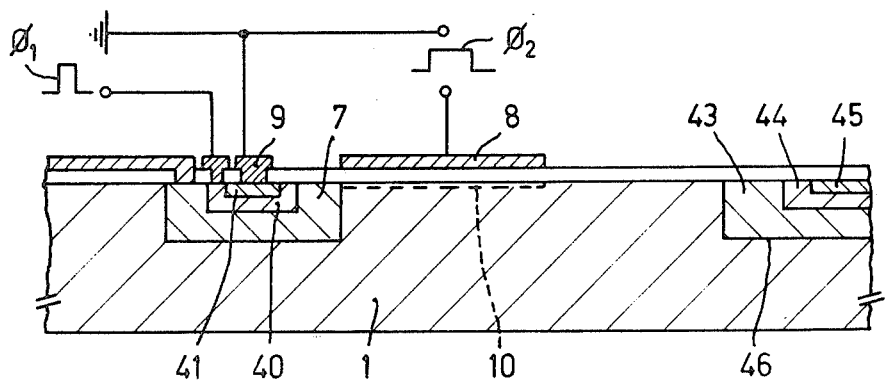

The invention will now be described in greater detail with reference to a few embodiments and the drawing, in which FIG. 1 is a diagrammatic plan view of a part of a device according to the invention, FIG. 2 is a diagrammatic cross-sectional view of the device shown in FIG. 1 taken on the line II—II, FIGS. 3 and 4 show the clock voltages $\phi_1$ and $\phi_2$ used in this example as a function of time and FIGS. 5, 6 and 7 are diagrammatic cross-sectional views through three different other embodiments of the device.

FIG. 8 is a diagrammatic cross-sectional view through a further embodiment of the device.

The FIGS. are diagrammatic and not drawn to scale. Corresponding components are generally referred to by the same reference numerals in the various embodiments. For clarity, the dimensions, in particular in the direction of thickness, are exaggerated. In order to avoid complexity of the drawing, insulation layers and metal layers provided on the surface are shown to have the same thicknesses everywhere in the sectional views, which need not always be the case in practice.

FIG. 1 is a diagrammatic plan view and FIG. 2 a diagrammatic cross-sectional view taken on the line II—II of FIG. 1 of a semiconductor device according to the invention. The device comprises a semiconductor body having a first region, in this example a p-type substrate 1, for example of silicon. Provided in the substrate 1 is an integrated circuit, for example a circuit having insulated gate field effect transistors, one of which is shown diagrammatically on the right-hand side in the figure with n-type source zone 2, n-type drain zone 3 and gate electrode 4 which is separated from the substrate 1 by an insulating layer 5 of silicon oxide. The first region 1 (the substrate) adjoins a substantially flat surface 6 of the semiconductor body. A second n-type conductive region 7 likewise adjoins said surface 6. An electrically conductive field electrode 8 in the form of an aluminium layer is provided on the oxide layer 5.

Now it is desired to bring the substrate 1 to a given potential, for example, negative potential. This occurs generally by providing the substrate with a connection conductor which is set up at the desired potential.

In the device described, however, such a substrate connection is not necessary. Actually according to the invention, a supply conductor 9 is provided on the surface of the body outside the substrate 1 and is maintained at a reference potential, in this example, at earth potential, and serves to supply charge carriers, in this case electrons, from the second region 7 to an inversion layer 10 which is to be formed below the field electrode 8 at the surface 6 of the first region 1 and which adjoins the second region 7. Furthermore according to the invention, an electronic switch with which the flow back of charge from the inversion layer 10 to the connection conductor 9 can be prevented is incorporated in the current path between the supply conductor 9 and the second region 7. In this example, said electronic switch consists of an insulated gate field effect transistor which is formed by the second region 7, a further n-type surface zone 11 which is connected to the supply conductor 9, and a gate electrode 12 present on the oxide layer 5. The surface of the field electrode 8 which is not drawn to scale in the drawing, is approximately 11x as large as that of the part of the gate electrode 12 present between the zones 7 and 11. Said ratio is preferably chosen to be even larger, for example at least 50 to 100 or more, so as to rapidly bring a large quantity of charge in the first region.

The operation of this device is as follows. A first clock voltage $\phi_1$ is applied to the gate electrode 12 relative to earth (see FIG. 3). A second clock voltage $\phi_2$ is applied to the field electrode 8 relative to earth (see FIG. 4). In FIGS. 3 and 4, said clock voltages which are both positive relative to earth are plotted as a function of time t. The amplitudes of the clock voltage $\phi_1$ and $\phi_2$ need not be the same but must both be large enough to enable the formation of inversion layers 10 and 13 (see FIG. 2) at the underlying silicon surface. As is shown in FIGS. 3 and 4, first both voltages $\phi_1$ and $\phi_2$ are applied, for example, at the instant $t_o$ in this example. Electrons can now flow from the connection conductor 9 to the zone 11, and also from the zone 11 to the second region 7 via the inversion layer 13, and from the second region 7 to the inversion layer 10. It is, of course, not necessary to switch on the voltages $\phi_1$ and $\phi_2$ at the same instant.

First the gate electrode voltage $\phi_1$ is then switched off at the instant $t_1$, so that the inversion layer 13 disappears. The electronic switch (7, 11, 12) is now open and electrons can no longer flow from the region 7 to the conductor 9. When subsequently at the instant $t_2$ the field electrode voltage $\phi_2$ is switched off, the charge in the inversion layer 10 supplied from the supply conductor 9 will remain for thegreater part in the substrate 1 when said inversion layer disappears, as a result of which said substrate 1 obtains a certain (negative) potential, without the substrate being provided with a connection conductor.

When this process is repeated during successive clockpulses, the substrate 1 will obtain an ever higher potential due to the supplied charge. As a result of this the threshold voltage of the MOS-transistor (7, 11, 12) and the threshold voltage of the electrode 8 increase until the substrate potential is so high that at the potential $\phi_1$ no charge can be supplied any longer via the inversion layer 13 and/or at the potential $\phi_2$ no inversion layer 10 can be formed any longer. At that instant the threshold voltage of the transistor (7, 11, 12) is equal to the amplitude of the clock voltage $\phi_1$ or the threshold voltage of the electrode 8 is equal to $\phi_2$. So by the choice of the amplitude of either $\phi_1$ or $\phi_2$ (dependent upon which of these two clock pulses becomes first equal to the corresponding threshold voltage), the negative potential of the substrate 1 and hence of the remaining insulated gate field effect transistors formed in said substrate, for example the transistor (2, 3, 4), can be fixed.

Instead of by means of an electronic switch the flow back of charge from the inversion layer 10 to the region 7 could also be restricted considerably by making the field electrode 8 very narrow in the proximity of the region 7 so that the charge can flow away only with difficulty from the inversion layer 10 via the part of the inversion layer which is present below the narrow part of the electrode 8 and which is also very narrow. The drawback of this is, however, that the charging via the inversion layer also occurs very slowly, which usually is undesired.

The fact that the above described device has no substrate connection can be of particular advantage in many cases. In certain circumstances an envelope will do which is considerably smaller and simpler than would be the case without the use of the invention. This is due to the fact that successive standardized types of envelopes usually have a largely different number of connection conductors and that thus one connection conductor more or less can determine the choice between two successive types of envelopes.

The clock voltages $\phi_1$ and $\phi_2$ can be derived, for example, from one or more clock voltages which are used to operate the integrated circuit to which the transistor (2, 3, 4) belongs. $\phi_1$ and $\phi_2$ can be derived directly from said clock voltage sources or be derived therefrom, for example, via a divider circuit. It is also possible that the two voltages $\phi_1$ and $\phi_2$ are derived from one single clock voltage used for operating the integrated circuit.

FIG. 5 is a diagrammatic cross-sectional view of another device according to the invention. In this case the first region 1 is not formed by the substrate but by an island 1, for example an n-type island, which is provided in a p-type substrate 20 and forms a p-n junction 21 therewith. The field effect transistor (7, 11, 12) and the field electrode 8 have an analogous configuration to the previous example, only the conductivity type of the various zones in this example are opposite to those of the corresponding zones of the previous example as well as the polarity of the clock voltages $\phi_1$ and $\phi_2$ which are now negative relative to earth. Via the p-type inversion layers 10 and 13 holes from the p-type zone 7 are now introduced into the n-type island 1 by the mechanism described in the previous example, as a result of which the island 1 obtains a positive potential relative to earth. Said positive potential is now used, for example, to bring a further n-channel field effect transistor (having n-type source and drain zones 23 and 24 and insulated gate electrode 25 belonging to the integrated circuit) in the conductive condition in that the island 1 is conductively connected to the gate electrode 25 via a connection contact 26 and a conductor 27 which may consist, for example, of a metal layer provided on the oxide layer 5.

FIG. 6 is a diagrammatic cross-sectional view of another embodiment of the device according to the invention in which, in contrast with the preceding examples, the electronic switch is not formed by insulated gate field effect transistor but by a p-n diode having a p-n junction 32 of which one side, the p-type zone 30, is connected, via a short circuit metal layer 36, to the n-type zone 7 and the other side of which, the n-type zone 31, is connected to the supply conductor 9. The p-n junction may also be replaced by a Schottky-junction between the source electrode 9 and the region 30, for example, to avoid stray transistor action. As in FIG. 5 the parts corresponding to the first example have the same reference numerals in this case also. The region 1 and 30 are p-type conductive, the zones 7, 31, 32 and 34 are n-type conductive.

As in the first example, a positive clock voltage $\phi_2$ relative to earth is applied to the field electrode 8, while the connection 9 is grounded. The clock voltage $\phi_2$ is the voltage across the junction 32 which is produced by the clock voltage pulse $\phi_2$. The voltage $\phi_2$ is chosen to be so large that as a result an inversion layer 10 is formed below the field electrode 8 and a voltage is the forward direction is also set up across the p-n junction 32 which is larger than the threshold voltage, so in the case of silicon larger than approximately 0.7 Volt. Charge carriers can then flow from earth across the junction 32 via the p-type zone 30 and the metal layer 36 to the (second) region 7 and electrons can flow from the region 7 to the inversion layer 10.

The clock voltage $\phi_2$ is then switched off. The charge carriers, in this case the electrons, can now no longer flow away from the region 7 via the diode to earth and the charge in the inversion layer 10 will remain for the greater part in the substrate 1 and charge it to a given potential in an analogous manner to the preceding examples, for example in order to give a MOS-transistor (33, 34, 35) belonging to the integrated circuit a previously chosen threshold voltage.

If desired a suitable voltage may be applied between the connection conductor and earth, for example, a clock voltage which is negative relative to earth and which, prior to switching off $\phi_2$, is reduced to such a value that when $\phi_2$ is switched off the junction 32 is in a substantially nonconductive condition.

In the latter example the electronic switch according to the invention was a diode.

In order to illustrate the variety of possible constructions according to the invention, FIG. 7 shows diagrammatically an embodiment in which the electronic switch is formed by a bipolar transistor having n-type emitter zone 41, p-type base zone 40 and n-type collector zone (the "second" region) 7. For example, the transistor (41, 40, 7) can be switched to a conductive condition by a clock pulse $\phi_1$ at the base with an emitter which is set up at a reference potential, for example earth, in which electrons flow from earth via the emitter to the collector 7. When a sufficiently high clock pulse $\phi_2$ is set up at the field electrode 8, an inversion layer 10 is formed below the electrode 8. When the voltage $\phi_1$ drops out, the transistor (41, 40, 7) comes in the non-conductive condition and the return path of the electrons from the region 7 to earth is cut off and when subsequently the voltage $\phi_2$ is switched off, the charge of the inversion layer 10 is again used for a greater part to charge the substrate 1. Other circuit elements are furthermore provided in the substrate 1 of which FIG. 7 shows, for example, on the right-hand side diagrammatically a part of a transistor (43, 44, 45) provided in an n-type island 43 and having a p-type base 44 and n-type emitter 45. The negative substrate potential obtained according to the invention may serve, for example, to strongly bias the island-insulation p-n junction 46 in the reverse direction, as a result of which interalia the stray capacity of said junction decreases considerably.

FIG. 8 is a diagrammatic cross-sectional view of a semiconductor device according to a further embodiment of the invention some of the elements thereof corresponding to those in FIG. 2 and being designated by the primed corresponding numbers. The device comprises a semiconductor body having a first region, in this example a p-type substrate 1', for example of silicon. Provided in the substrate 1' there can be an integrated circuit, for example a circuit having insulated gate field effect transistor, one of which is shown diagrammatically on the righthand side in the figure with n-type source zone 2', n-type drain zone 3' and gate electrode 4' which is separated from the substrate 1' by an insulating layer 5' of silicon oxide. The first region 1' (the substrate) adjoins a substantially flat surface 6' of the semiconductor body. A second n-type conductive region 7' likewise adjoins said surface 6'. An electrically conductive field electrode 8' in the form of an aluminum layer is provided on the insulating layer 5'.

A supply conductor 9' is provided on the surface of the body outside the substrate 1' and is maintained at a reference potential, in this example, at earth potential, and serves to supply charge carriers, in this case electrons, from the second region 7' to an inversion layer 10' which is to be formed below the field electrode 8' at the surface 6' of the first region 1' and which adjoins the second region 7'. Furthermore according to the invention, an electronic switch, with which the flow back of charge from the inversion layer 10' to the connection conductor 9' can be prevented, is incorporated in the current path between the second region 7' and the inversion layer 10'. In this example, said electronic switch consists of gate electrode 50 which is present on the insulating layer 5' and below which, with a suitable voltage applied to the gate electrode 50, there is formed a second inversion layer 51 via which charge carriers can flow from the second region 7' to the first inversion layer 10'. The supply conductor 9' is connected to the second region 7', preferably.

The operation of this device is as follows. A first clock voltage $\phi_1$ is applied to the gate electrode 50 relative to earth (see FIG. 3). A second clock voltage $\phi_2$ is applied to the field electrode 8' relative to earth (see FIG. 4). In FIGS. 3 and 4, said clock voltages which are both positive relative to earth are plotted as a function of time t. The amplitudes of the clock voltage $\phi_1$ and $\phi_2$ need not be the same but must both be large enough to enable the formation of inversion layer 10 and 13 (see FIG. 2) at the underlying silicon surface. As is shown in FIGS. 3 and 4, first both voltages $\phi_1$ and $\phi_2$ are applied, for example, at the instant $t_o$ in this example. Electrons can now flow from the connection conductor 9' to the second region 7' and from the second region 7' to the inversion layer 10' via inversion layer 51 located below the gate electrode 50. It is, of course, not necessary to switch on the voltages $\phi_1$ and $\phi_2$ at the same instant.

First the gate electrode voltage $\phi_1$ is then switched off at the instant $t_1$, so that the inversion layer 51 disappears. The electronic switch 51 is now open and electrons can no longer flow from the region 1' to the conducutor 9'. When subsequently at the instant $t_2$ the field electrode voltage $\phi_2$ is switched off, the charge in the inversion layer 10' supplied from the supply conductor 9' will remain for the greater part in the substrate 1' when said inversion layer disappears, as a result of which said substrate 1' obtains a certain (negative) potential, without the substrate being provided with a connection conductor. When this process is repeated during successive clock pulses, the substrate 1 will obtain an ever higher potential due to the supplied charge.

Of course the invention is not restricted to the embodiments described since many variations are possible to those skilled in the art without departing from the scope of this invention. For example, semi-conductor bodies consisting of a material other than silicon may be used, possibly consisting of different semiconductor materials which mutually form hetero junctions. Insulating layers other than silicon oxide may be used, for example, silicon nitride or aluminium oxide. The voltages used may be adapted to the given circumstances by those skilled in the art and notably need not be rectangular pulses. Another reference potential instead of earth may be used which in certain circumstances may vary with respect to earth. The conductivity types of the various zones may all together to be replaced by their opposite conductivity types. The dimensionsions and geometry of the device according to the invention may be varied within wide limits.

What is claimed is:

1. A semiconductor device having an integrated circuit comprising:
    (a) a semiconductor body portion having a first surface;
    (b) a first region of a first type conductivity and a second region of a second type conductivity in said body portion that adjoin said first surface;
    (c) an electrically insulating layer on said surface at said first region;
    (d) an electrically conductive field electrode layer over said insulating layer and adapted when a potential is applied thereto to form an inversion layer at said surface at a part of said first region below said field electrode;
    (e) supply conductor means electrically connected to a region of said surface of said body separated from said first region for supplying charge carriers via a series current path through said second region to form the inversion layer;
    (f) electronic switch means serially connected in the series current path between said supply conductor means and said part of the first region where the inversion layer is formed for allowing charge carriers to flow to form said inversion layer when in the conductive state, and for preventing flow-back of charge from said inversion layer to said supply conductor means when in the nonconductive state to allow the carriers constituting said inversion layer to recombine in the first region to provide a net charge therein when the applied potential is removed and the inversion layer collapsed;
    (g) a first semiconductor circuit element in the body; and
    (h) means for connecting said semiconductor circuit element to said first region in order to electrically enable said first semiconductor circuit element.

2. A semiconductor device as in claim 1, wherein said first region part adjoins said second region.

3. A semiconductor device as in claim 1, wherein said electronic switch means is incorporated in the current path between said supply conductor means and said second region.

4. A semiconductor device as in claim 1, wherein said first region is free of any direct connection to an external supply conductor.

5. A semiconductor device as in claim 1, wherein said first region comprises the substrate of said integrated circuit.

6. A semiconductor device as in claim 1, wherein said first region comprises an island-shaped region which is electrically insulated from said semiconductor body portion.

7. A semiconductor device as in claim 1, wherein said electronic switch means comprises a rectifying diode having one side thereof connected to said second region and the other side thereof connected to said supply conductor means, said diode being connected with suitable polarity to allow charge carriers to flow to said inversion layer and to prevent the flowback of charge from said inversion layer.

8. A semiconductor device as in claim 1, wherein said electronic switch means comprises a transistor.

9. A semiconductor device as in claim 8, wherein said electronic switch means comprises an insulated gate field effect transistor comprising source and drain zones that respectively comprise said second region and a surface zone of said second conductivity type which is separated from said second region, said supply conductor being provided to said surface zone.

10. A semiconductor device as in claim 9, wherein said field effect transistor comprises a gate electrode disposed between said second region and said surface zone of said second conductivity type and said field electrode has a surface which is from at least 10 times to at least about 50 times larger than the surface of said gate electrode.

11. A semiconductor device as in claim 10, comprising means for applying voltages of the same polarity to said gate electrode and said field electrode, said voltages being of sufficient value to cause inversion layers to be formed below said electrodes, and means for first reducing said gate electrode voltage and then said field electrode voltage to a value at which the inversion layers present below said electrodes collapse.

12. A semiconductor device as in claim 11, comprising a further semiconductor circuit element spaced apart from said electrodes and means for applying clock voltages to said electrodes to provide said volages, said clock voltages further being used to operate said semiconductor circuit element.

13. A semiconductor device as in claim 10, further comprising means for applying a succession of alternating repetitive pulsed voltages of the same polarity to said gate electrode and said field electrode for alternately increasing and decreasing said gate electrode voltage and said field electrode voltage to cause said first region to acquire a potential that ultimately prevents the generation of an inversion layer under at least one of said electrodes at the applied voltage.

14. A semiconductor charge pump device comprising:

(a) a semiconductor body portion having a first surface;
(b) a first region of a first type conductivity and a second of a second type conductivity in said body portion that adjoin said first surface;
(c) an electrically insulating layer on said surface at said first region;
(d) an electrically conductive field electrode layer over said insulating layer and adapted when a potential is applied thereto to form an inversion layer at said surface at a part of said first region below said field electrode;
(e) supply conductor means electrically connected to a region of said body separated from said first region for supplying charge carriers via a series current path through said second region to form the inversion layer; and
(f) electronic switch means serially connected in the series current path between said supply conductor means and said part of the first region where the inversion layer is formed for allowing charge carriers to flow to form said inversion layer when in the conductive state, and for preventing flow-back of charge from said inversion layer to said supply conductor means when in the nonconductive state to allow the carriers constituting said inverson layer to recombine in the first region to provide a net charge therein when the applied potential is removed and the inversion layer collapsed.

15. A semiconductor device as in claim 14, further comprising means for applying voltages of the same polarity to said electronic switch means and said field electrode, to cause inversion layers to be formed in said electronic switch means and below said field electrode, and for subsequently causing first the inversion layer below said electronic switch means and then the inversion layer below said field electrode to collapse, the polarity of the net charge provided in said first region being opposite to that of said applied voltages.

16. A semiconductor device as in claim 15, wherein the switching control element of said electronic switch means comprises a gate electrode above said insulating layer.

17. A semiconductor device as in claim 16, wherein said inversion layer in said electronic switch means is disposed between said inversion layer located below said field electrode and said second region.

18. A semiconductor device comprising:
(a) a semiconductor body portion having a first surface;
(b) a first region of a first type conductivity and a second region of a second type conductivity in said body portion that adjoin said first surface;
(c) an electrically insulating layer on said surface at said first region;
(d) an electrically conductive field electrode layer over said insulating layer and adapted when a potential is applied thereto to form an inversion layer at said surface at a part of said first region below said field electrode;
(e) supply conductor means electrically connected to a region of said surface of said body separated from said first region for supplying charge carriers via a series current path through said second region to form the inversion layer; and
(f) electronic switch means serially connected in the series current path between said supply conductor means and said part of the first region where the inversion layer is formed for allowing charge carriers to flow to form said inversion layer when in the conductive state, and for preventing flow-back of charge from said inversion layer to said supply conductor means when in the nonconductive state to allow the carriers constituting said inversion layer to recombine in the first region to provide a net charge therein when the applied potential is removed and the inversion layer collapsed.

19. In a semiconductor charge pumping device including a semiconductor chip having a pair of abutting regions of opposite conductivity type, and gate means for creating an inversion layer comprising minority carriers on at least a portion of the surface of the first of said regions, the improvement which comprises means for causing said inversion layer to collapse in a first part of said portion before said inversion layer collapses in a second part of said portion, said first part being located between said second part and said second region, and means for allowing said minority carriers to recombine in said first region to provide a net charge therein.

20. A semiconductor charge pumping device as recited in claim 19, where said first part of said portion of said first region abuts said second regio.

21. A semiconductor charge pumping device which comprises:
(a) a chip of semiconductor material having two abutting regions of opposite conductivity type;
(b) a first gate, said first gate covering a first portion of the first of said regions and so disposed with respect to the second of said regions that a first inversion layer under said gate will be established upon application of a suitable potential to said first gate;
(c) a second gate covering a second portion of said first region, said second gate being disposed with respect to said first gate such that a second inversion layer comprising minority carriers established under said second gate upon application of potential to said second gate will abut said first inversion layer; and
(d) means for allowing said minority carriers of said second inversion layer to recombine in said first region to provide a net charge therein.

22. A semiconductor charge pumping device as recited in claim 21, where said second inversion layer does not abut said second region.

23. A semiconductor charge pumping device as recited in claim 22, where said first region is p-type silicon.

24. A semiconductor charge pumping device as recited in claim 22, where said gates are coupled to voltage sources for repetitively applying potentials to said gates whereby inversion layers are formed under said gates, the potential on said second gate persisting after removal of potential from said first gate.

25. A semiconductor device comprising a semiconductor body portion that includes a first region of first type conductivity and a second region of opposite type conductivity, an insulating layer disposed at said semiconductor body over at least part of said first region, a field electrode disposed at said insulating layer and over a surface adjacent portion of said first region to provide when suitably biased an inversion layer in said portion, an unrestricted source of carriers, means for serially interconnecting said unrestricted source, second region, and first region portion to form a series path for carrier flow from the unrestricted source to the first region portion via said second region, electronic switch means serially conneced in the series carrier flow path between the unrestricted source and the first region portion and providing when turned on a direct conductive connection from the unrestricted source to the first region portion via the second region, means for turning on said switch and maintaining the switch in a turned-on condition for at least a part of the time that an inversion layer forming potential is applied to the field electrode to produce an inversion layer in said first region portion by carriers supplied from said second region, and means for turning off the switch before removing the inversion layer forming potential applied to the field electrode to allow the inversion layer to collapse and the carriers comprising said inversion layer to recombine in the first region to provide a net charge therein.

26. A device as recited in claim 25, wherein said first region portion is free of direct conductive connection thereto external of said semiconductor body portion.

27. A device as recited in claim 25, wherein said electronic switch comprises an insulated gate device in said semiconductor body portion which is operative in response to a voltage applied to the gate thereof to form an inversion layer in said body portion.

28. A device as recited in claim 25, wherein said means for turning on said switch and maintaining said switch in a turned-on condition comprises means for applying a pulse potential to said electronic switch.

29. A semiconductor device comprising a semiconductor body that includes a first region of first type conductivity and a second region of opposte type conductivity, an insulating layer disposed at said semiconductor body over at least part of said first region, a field electrode disposed at said insulating layer and over a surface-adjacent portion of said first region to provide when suitably biased an inversion layer in said portion, an unrestricted source of carriers, means for interconnecting said unrestricted source, second region, and first region portion to form a series path for carrier flow from the unrestricted source to the first region portion via said second region, electronic switch means connected in the series carrier flow path between the unrestricted source and the first region portion and providing when turned on a direct conductive connection from the unrestricted source to the first region portion via the second region, means for turning on said switch and maintaining the switch in a turned-on condition for at least a part of the time that an inversion layer forming potential is applied to the field electrode to produce an inversion layer in said first region portion by carriers supplied from said second region, and means for turning off the switch before removing the inversion layer forming potential applied to the field electrode, said electronic switch comprising a p-n diode comprising a first zone having said opposite type conductivity and a second zone of said first type conductivity, said second region being of said opposite type conductivity, said first zone being electrically connected to said unrestricted source of carriers and said second zone and second region being short-circuited.

30. A semiconductor device comprising a semiconductor body that includes a first region of first type conductivity and a second region of opposite type conductivity, an insulating layer disposed at said semiconductor body over at least part of said first region, a field electrode disposed at said insulating layer and over a surface-adjacent portion of said first region to provide when suitably biased an inversion layer in said portion, an unrestricted source of carriers, means for interconnecting said unrestricted source, second region, and first region portion to form a series path for carrier flow from the unrestricted source to the first region portion via said second region, electronic switch means connected in the series carrier flow path between the unrestricted source and the first region portion and providing when turned on a direct conductive connection from the unrestricted source to the first region portion via the second region, means for turning on said switch and maintaining the switch in a turned-on condition for at least a part of the time that an inversion layer forming potential is applied to the field electrode to produce an inversion layer in said first region portion by carriers supplied from said second region, and means for turning off the switch before removing the inversion layer forming potential applied to the field electrode, said electronic switch comprising a bipolar transistor having a collector zone of said opposite type conductivity, a base zone of said first type conductivity provided in said second region, and an emitter zone of said opposite type conductivity provided in said base zone, said second region comprising said collecter zone, said means for turning on said switch comprising means for applying a pulse potential to said base region, and said means for interconnecting said unrestricted source, second region, and first region portion comprising said emitter zone.

* * * * *

UNITED STATES PATENT AND TRADEMARK OFFICE
CERTIFICATE OF CORRECTION

PATENT NO. : 4,255,677
DATED : March 10, 1981
INVENTOR(S) : Lieuwe Boonstra et al It is certified that error appears in the above-identified patent and that said Letters Patent is hereby corrected as shown below:

Claim 12, line 4, "volages" should be -- voltages --
Claim 20, line 3, "regio" should be -- region --
Claim 25, line 7, "surface adjacent" should be -- surface-adjacent --

Signed and Sealed this

Twenty-eighth Day of August 1984

[SEAL]

Attest:

Attesting Officer

GERALD J. MOSSINGHOFF

Commissioner of Patents and Trademarks

UNITED STATES PATENT AND TRADEMARK OFFICE
CERTIFICATE OF CORRECTION

PATENT NO. : 4,255,677
DATED : March 10, 1981
INVENTOR(S) : LIEUWE BOONSTRA ET AL It is certified that error appears in the above-identified patent and that said Letters Patent is hereby corrected as shown below:

Insert Claims 31 and 32 as part of Letters Patent

Claim 31, --A semiconductor device having an integrated circuit comprising:

(a) a semiconductor body portion having a first surface;

(b) a first region of a first type conductivity and a second region of a second type donductivity in said body portion that adjoin said first surface;

(c) an electrically insulating layer on said surface at said first region;

(d) an electrically conductive field electrode layer over said insulating layer and adapted when a potential is applied thereto to form an inversion layer at a part of said first region below said field electrode;

(e) supply conductor means electrically connected to a region of said surface of said body separated from said first region for supplying charge carriers via a series current path through said second region to form the inversion layer;

(f) electronic switch means serially connected in the series current path between said supply conductor means and said part of the first region where the inversion layer is formed for allowing charge carriers to flow to form said inversion layer when in the conductive state, and for preventing flow-back of charge from said inversion layer to said supply conductor means

UNITED STATES PATENT AND TRADEMARK OFFICE
CERTIFICATE OF CORRECTION

PATENT NO. : 4,255,677

DATED : March 10, 1981

INVENTOR(S) : LIEUWE BOONSTRA ET AL

It is certified that error appears in the above—identified patent and that said Letters Patent is hereby corrected as shown below:

when in the nonconductive state to allow the carriers constituting said inversion layer to recombine in the first region to provide a net charge therein when the applied potential is removed and the inversion layer collapsed;

(g) a further structural part of said body; and (h) means for connecting said further structural part to said first region in order to electrically enable said further structural part.—

Claim 27, —A semiconductor device as in Claim 26, wherein said further structural part is located in said first region.—

Signed and Sealed this

Ninth Day of December, 1986

Attest:

DONALD J. QUIGG

Attesting Officer

Commissioner of Patents and Trademarks